United States Patent [19]

Lopez

[11] Patent Number: 5,509,468
[45] Date of Patent: Apr. 23, 1996

[54] ASSEMBLY FOR DISSIPATING THERMAL ENERGY CONTAINED IN AN ELECTRICAL CIRCUIT ELEMENT AND ASSOCIATED METHOD THEREFOR

[75] Inventor: Roger Lopez, Louisville, Colo.

[73] Assignee: Storage Technology Corporation, Louisville, Colo.

[21] Appl. No.: 173,495

[22] Filed: Dec. 23, 1993

[51] Int. Cl.$^6$ ........................................ F28F 9/26
[52] U.S. Cl. .................... 165/144; 165/80.3; 257/713; 257/721; 361/689; 361/691
[58] Field of Search ..................... 361/719, 702, 361/699, 690, 691, 689, 687, 701; 165/144, 76, 80.5, 80.3, 80.4, 104.33, 20, 23; 257/721, 713, 712, 714

[56] References Cited

U.S. PATENT DOCUMENTS

| | | | |
|---|---|---|---|
| 2,943,842 | 7/1960 | Sullivan | 165/33 |
| 3,199,584 | 8/1965 | Heuer | 165/144 |
| 3,334,684 | 8/1967 | Roush et al. | 361/687 X |
| 3,481,393 | 12/1969 | Chu | 257/714 X |
| 4,009,423 | 2/1977 | Wilson | 257/714 X |
| 4,315,300 | 2/1982 | Parmerlee et al. | 165/80.4 X |
| 4,485,429 | 11/1984 | Mittal | 361/702 X |
| 4,682,032 | 7/1987 | Barrett | 257/721 X |
| 4,712,158 | 12/1987 | Kikuchi et al. | 361/702 X |
| 4,759,403 | 7/1988 | Flint et al. | 165/80.4 |
| 4,809,058 | 2/1989 | Funamoto et al. | 257/721 X |
| 4,865,123 | 9/1989 | Kawashima et al. | 165/104.33 |
| 5,088,005 | 2/1992 | Ciaccio | 257/714 X |
| 5,144,531 | 9/1992 | Go et al. | 361/699 X |

FOREIGN PATENT DOCUMENTS

| | | | |
|---|---|---|---|
| 3935272 | 4/1991 | Germany | 361/702 |
| 3070547 | 3/1988 | Japan | 257/721 |
| 6132686 | 5/1994 | Japan. | |

OTHER PUBLICATIONS

Cannistra et al., Module Board Service Frame, Jul. 1979, vol. 22, No. 2, pp. 688–689.
"Aavid aims to cool Pentium", Electronic Engineering Times, Aug. 9, 1993, p. 64.
CPC Coupling Form CP-1 by Colder Products Company, Revision 2, pp. 4–5, Sep., 1990.
"Controlled–Disbond Cladding Adds New Dimension to Metalworking", Design News, 1986.
"Computer Performance is Improved by using Unique Thermal Management and Computer Chip Cooling Technologies", MMR Technologies, Inc. Technical Brief.

Primary Examiner—John Rivell
Assistant Examiner—Christopher Atkinson
Attorney, Agent, or Firm—Robert H. Kelly; William J. Kubida; Holland & Hart

[57] ABSTRACT

An assembly, and associated method, for dissipating thermal energy contained in a circuit element of an electrical circuit which is releasably connectable with a substrate to form an electrical connection with the substrate when connected therewith. A fluid conduit extends through a plate member which is positionable proximate to the circuit element to be moveable therewith. The fluid conduit is coupled to a fluid manifold when the electrical circuit forms the electrical connection with the substrate. Coolant fluid is supplied to the manifold and, when the fluid conduit is coupled to the fluid manifold, also the fluid conduit. Thermal energy generated during operation of the electrical circuit is transferred to the coolant fluid flowing through the fluid conduit. The location of the fluid conduit is repositionable responsive to reconfiguration of the electrical circuit.

15 Claims, 5 Drawing Sheets

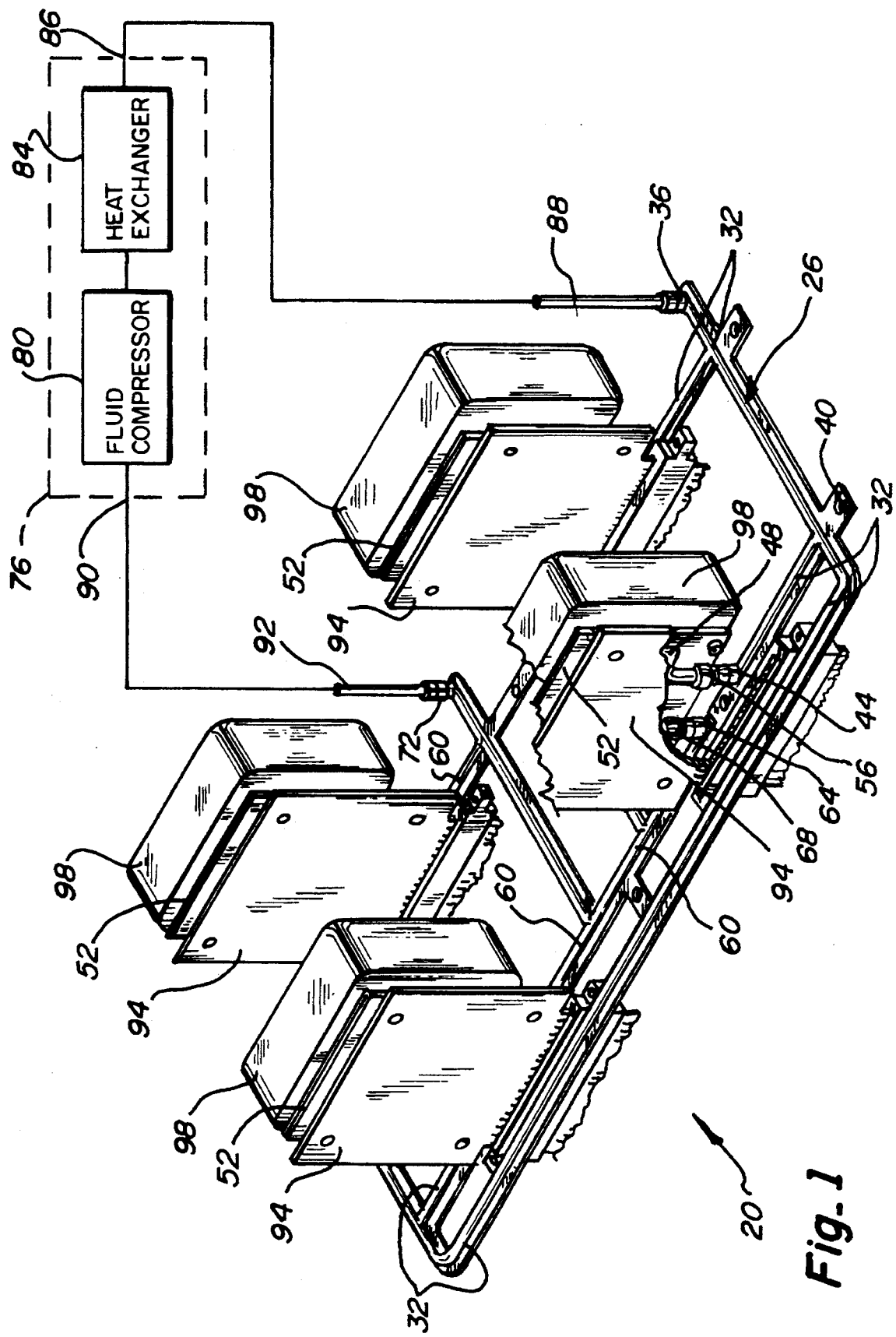

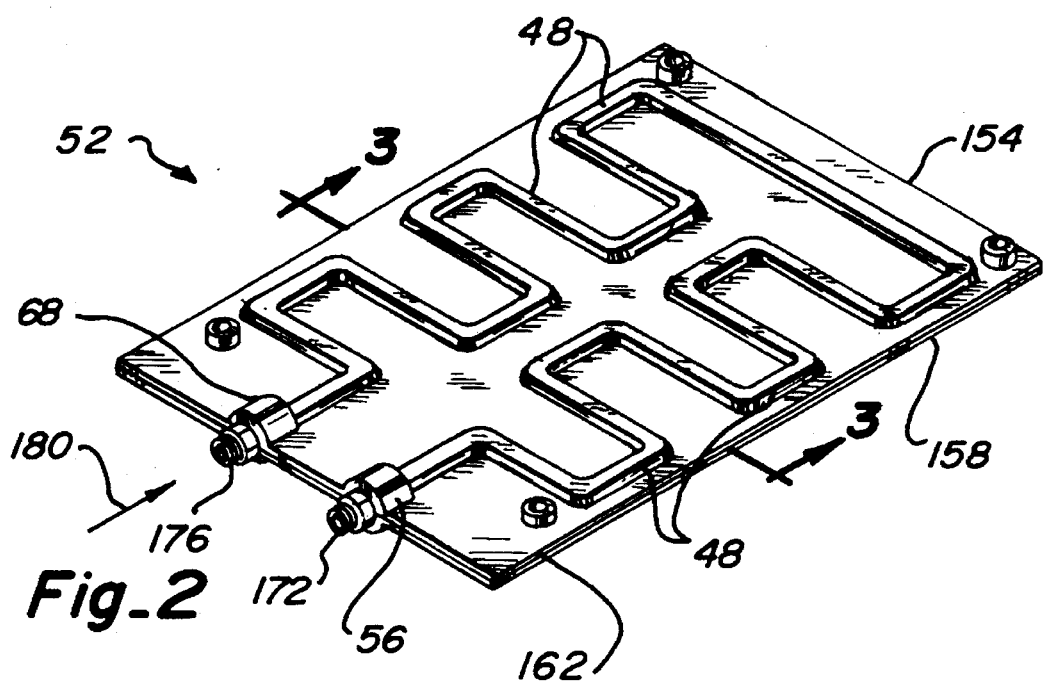
Fig_2
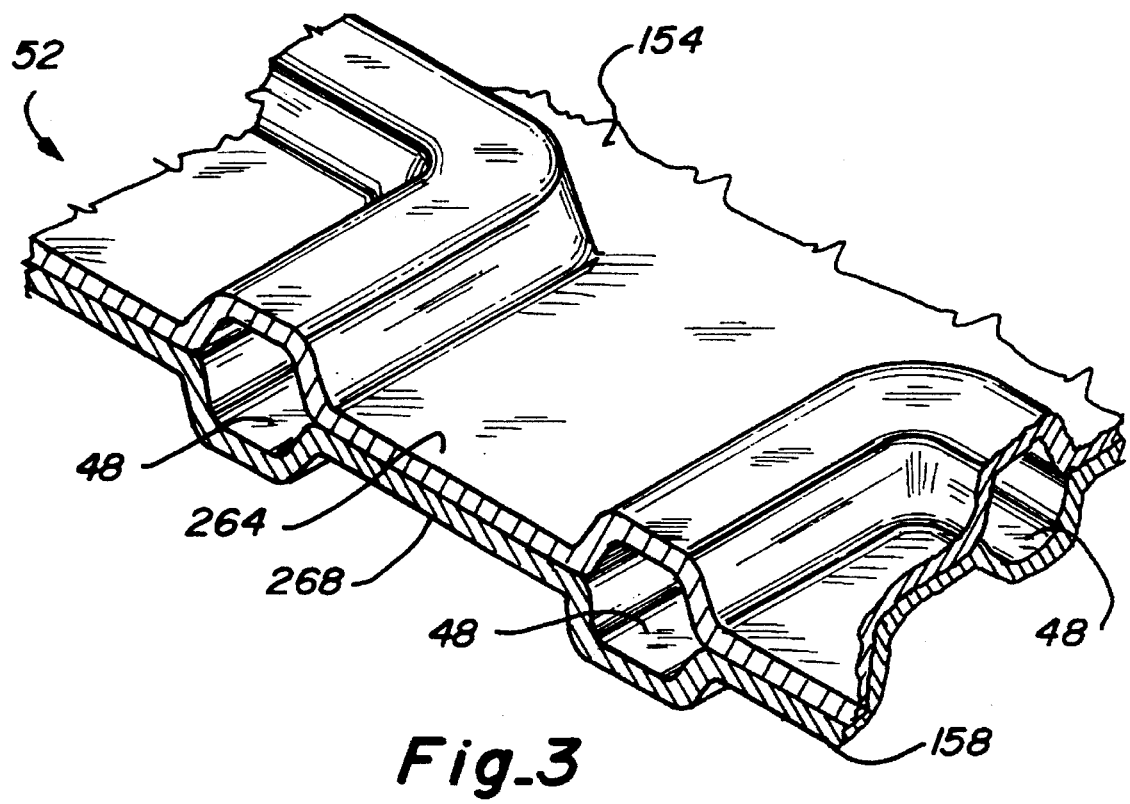
Fig_3

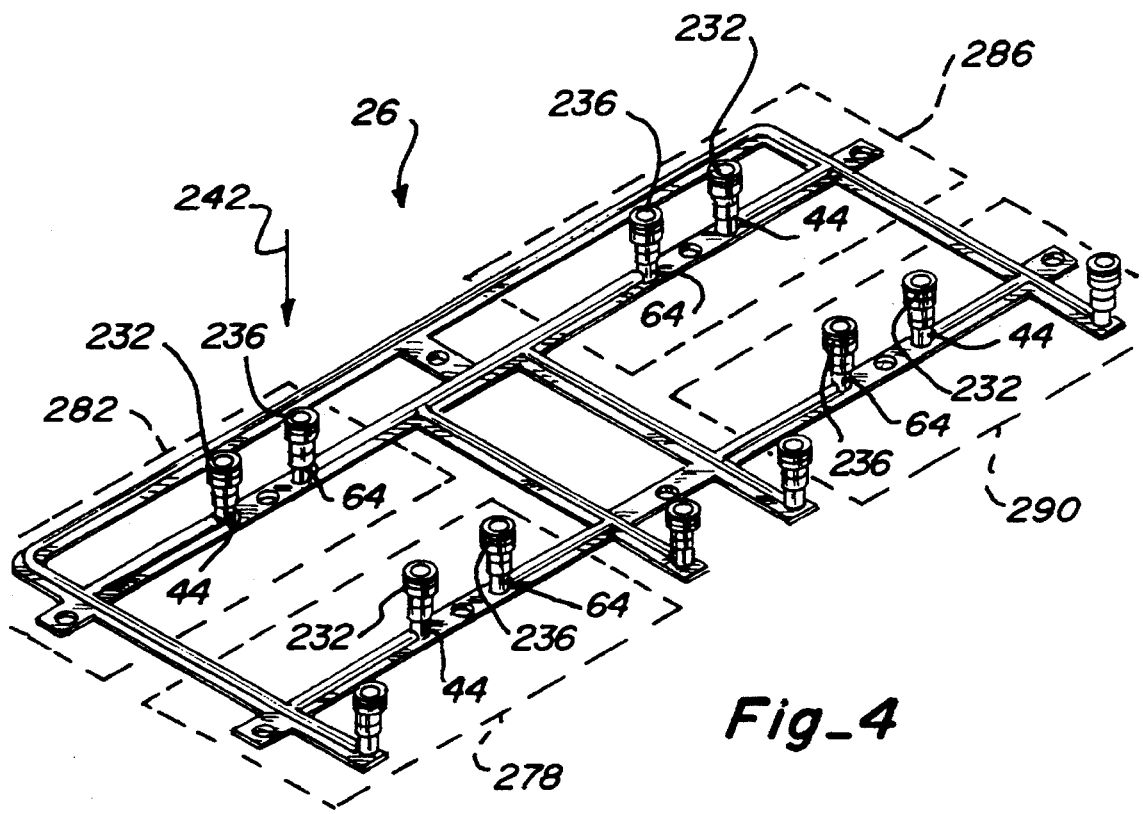
Fig_4
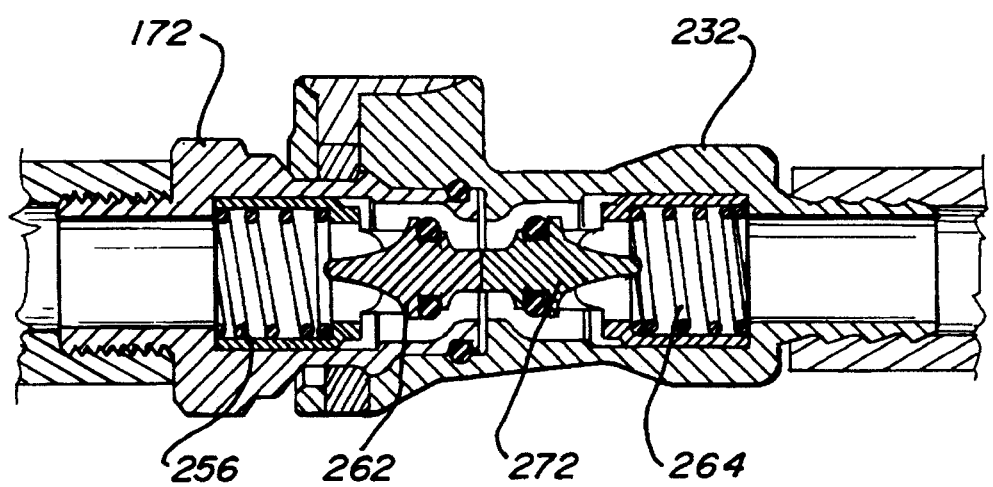
Fig_5

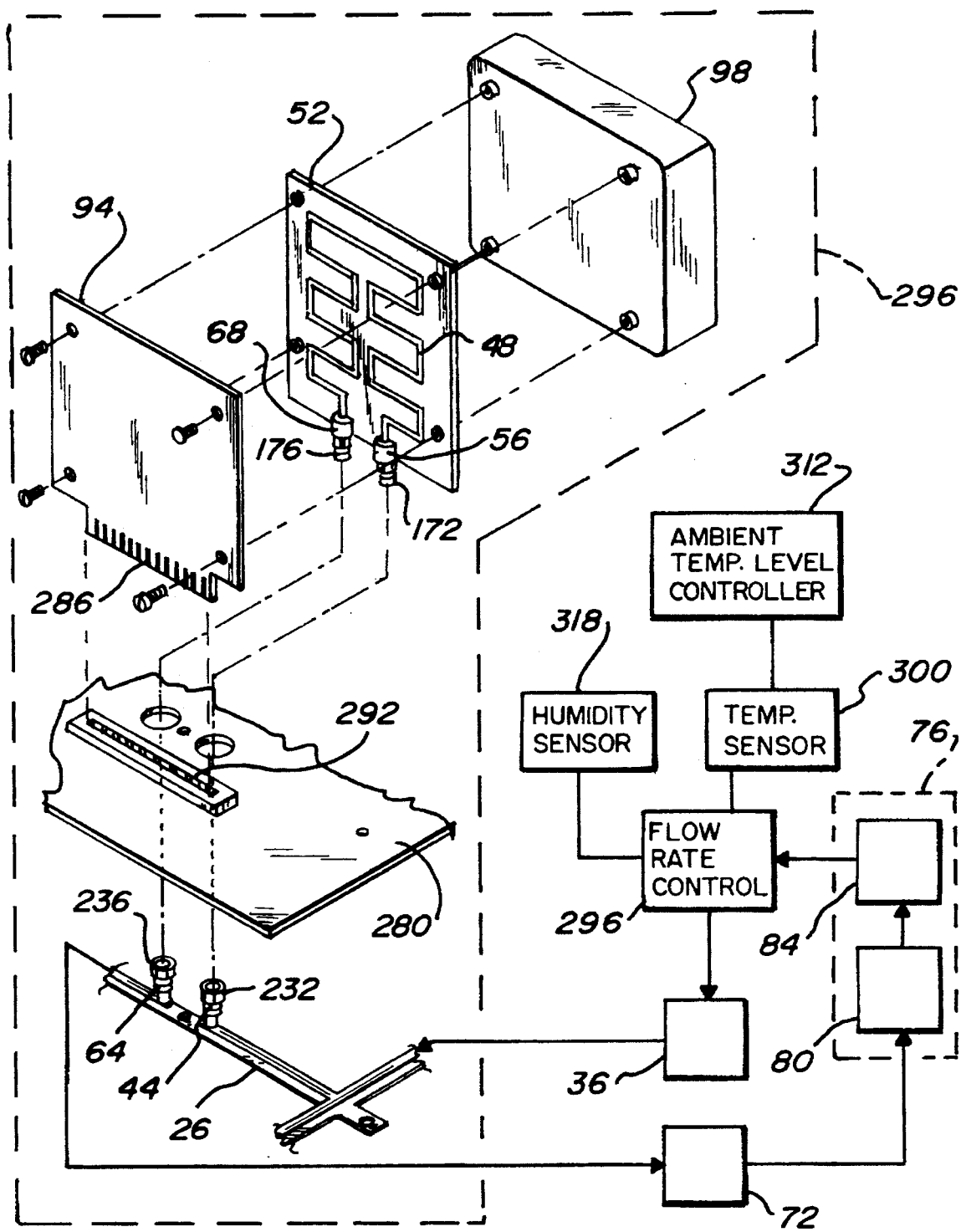
Fig_6

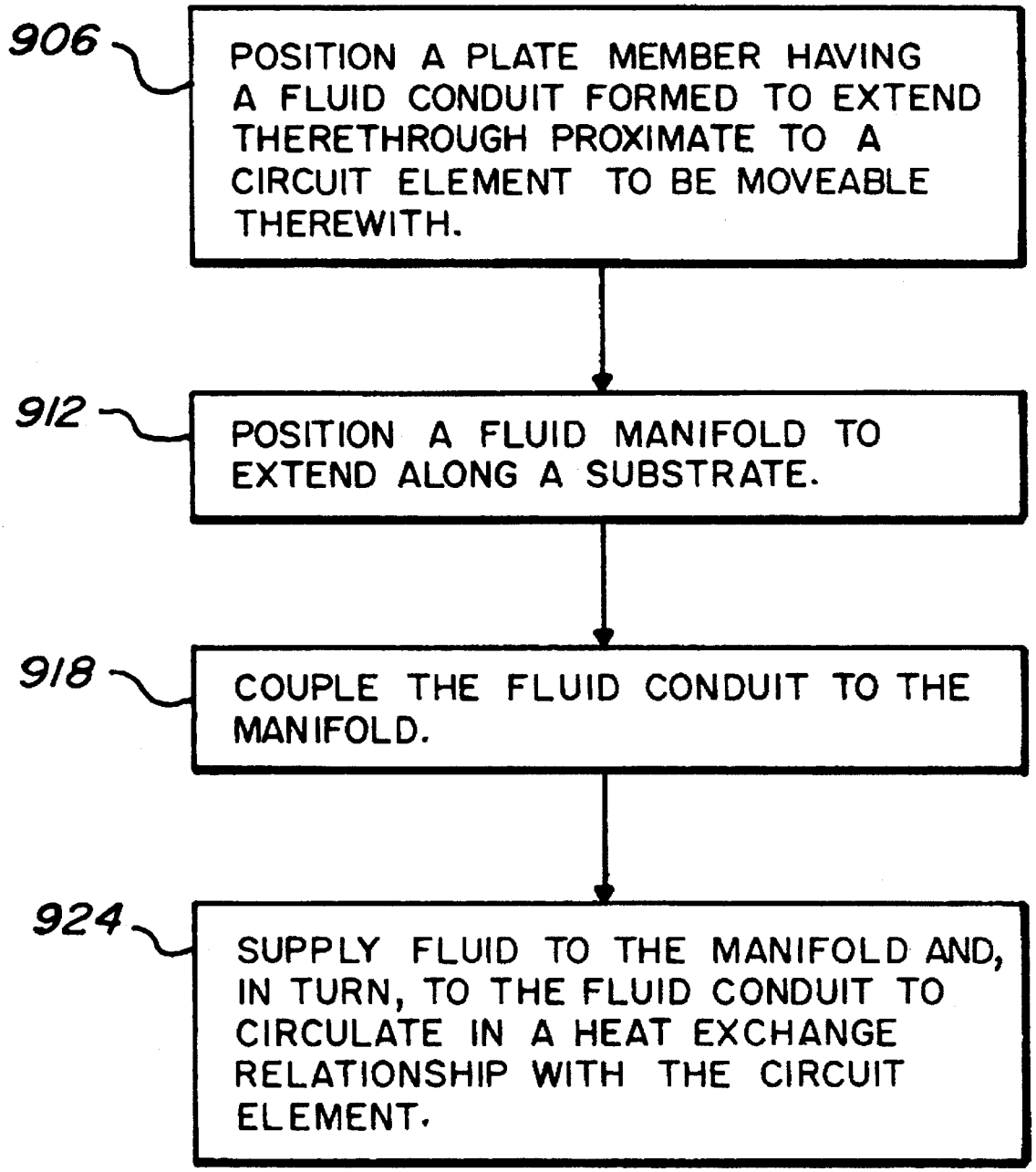
Fig_7

ASSEMBLY FOR DISSIPATING THERMAL ENERGY CONTAINED IN AN ELECTRICAL CIRCUIT ELEMENT AND ASSOCIATED METHOD THEREFOR

The present invention relates generally to a new and improved heat-dissipative apparatus for dissipating heat generated during operation of electrical circuitry and, more particularly, to an assembly having a fluid conduit positionable proximate to electrical circuitry mounted upon a circuit board which is connectable in a plugged connection with a computer motherboard wherein the fluid conduit becomes connected to a supply of coolant fluid when the circuit board is in the plugged connection with the computer motherboard.

BACKGROUND OF THE INVENTION

Thermal energy (i.e., heat energy) is a byproduct of normal operation of electrical circuitry. Thermal energy is generated as a result of frictional effects of charge flow during operation of the electrical circuitry. If the thermal energy is not dissipated, a buildup of such energy in the electrical circuitry (and circuit elements thereof) can result in inefficient or abnormal operation of the circuitry. Furthermore, the buildup of thermal energy can result in damage to the circuit elements of the electrical circuit.

Computer circuitry is an example of electrical circuitry which generates thermal energy as a byproduct of normal operation thereof. Computer circuitry oftentimes comprises a plurality of circuit boards which have edge connectors to permit plugged connection of the circuit boards to a computer backplane, commonly referred to as a computer motherboard. The circuit boards and the computer motherboard are typically housed within a supportive enclosure, such as a cabinet.

By merely plugging the circuit boards of the computer circuitry into the computer motherboard to be in the plugged connection therewith, electrical circuits disposed upon the circuit boards become connected to the motherboard and to each other by way of the motherboard. Reconfiguration of the computer circuitry is effectuated merely by addition or substitution of circuit boards having different circuits disposed thereupon.

The circuit boards of the computer circuitry are oftentimes positioned in a fairly dense arrangement within the supportive enclosure, and thermal energy generated during operation of the circuitry is not easily dissipated. If the thermal energy generated during operation of the computer circuitry is not properly dissipated, the aforementioned problems associated with buildup of thermal energy during operation of electrical circuitry can occur.

Heat dissipative apparatus is utilized to dissipate the thermal energy generated during operation of the computer circuitry (as well as other electrical circuitry) to prevent the buildup of thermal energy.

Convection-type, heat dissipative apparatus is a relatively inexpensive means by which to dissipate thermal energy generated during operation of the computer circuitry.

A heat sink comprised of a thermally-conductive material is an example of heat dissipative apparatus which dissipates thermal energy by convection. A heat sink is positioned in close physical proximity to circuit elements of the circuitry, and a thermally-conductive path is created between the circuit elements and the heat sink to permit thermal energy contained in the circuit elements to be conducted to the heat sink whereat the thermal energy is dissipated by convection. A fan is another example of heat dissipative apparatus which dissipates thermal energy by convection. A fan is operative to generate an air flow which assists in the dissipation of thermal energy. A fan is oftentimes used in conjunction with a heat sink.

Convection-type cooling apparatus is, however, inherently inefficient and is sometimes inadequate to dissipate adequately the thermal energy generated during operation of the circuitry, particularly when significant amounts of thermal energy are generated during operation of the circuitry.

Dissipation of the thermal energy generated during operation of the circuitry may also be facilitated by controlling the ambient temperature of the environment in which the circuitry is positioned. Computer circuitry, for instance, is sometimes positioned within a refrigeration unit. The lowered temperature of the air within the refrigeration unit permits dissipation of greater amounts of thermal energy generated during operation of the circuitry.

To permit access to the circuitry positioned within the refrigeration unit, the refrigeration unit oftentimes includes an access door. However, when the access door is opened to access the circuitry positioned within the refrigeration unit, warmer air from outside of the refrigeration unit mixes with cooler air within the refrigeration unit.

Problems can occur as a result of this mixing as, at lower temperature levels, the moisture-containing ability of the air is lower than at higher temperature levels. Moisture (i.e., water vapor) contained in the air at warmer levels condenses as the temperature levels of the air are reduced.

Once the access door of the refrigeration unit is reclosed and the refrigeration unit cools the warmer air mixed with the cooler air, water vapor condenses into liquid form.

Condensation of the water vapor into the liquid form can deleteriously affect operation of the circuitry positioned within the refrigeration unit if the vapor condenses upon the circuitry. As water is electrically-conductive, water vapor condensed upon circuitry can cause short circuiting of the circuitry. Hence, placement of computer circuitry within refrigeration units is oftentimes an unacceptable manner by which to assist in the dissipation of thermal energy generated during operation of the computer circuitry.

When the computer circuitry is comprised of superconducting devices, thermal energy generated during operation of the circuitry may be dissipated by placement of the circuitry within an inert liquid, such as liquid nitrogen. However, use of the inert liquid is not practical in normal applications.

Heat exchanger systems are also sometimes utilized to dissipate thermal energy generated during operation of computer circuitry. In a heat exchange system, a coolant fluid is circulated proximate to the circuitry, and thermal energy generated during operation of the circuitry is transferred to the coolant fluid as the coolant fluid circulates. However, once installed, existing heat exchanger systems for computers either cannot be altered to supply coolant fluid to additional, or alternate, locations, or can only be altered to supply the coolant fluid with significant difficulty.

It is with respect to these considerations and other background information relative to existing heat dissipative apparatus that the significant improvements of the present invention have evolved.

SUMMARY OF THE INVENTION

The present invention advantageously provides a thermal energy-dissipative assembly having fluid conduits for providing coolant fluid proximate to circuitry having circuit elements mounted upon circuit boards when the circuit boards are connected in plugged connections to a computer motherboard. The fluid conduits are connectable in plugged connections with a fluid manifold at any of various locations along the fluid manifold. A fluid conduit is positioned to be moveable together with a circuit board and is plugged into a plugged connection with the fluid manifold together with connection of the circuit board into a plugged connection with the motherboard. The fluid manifold provides the coolant fluid to the fluid conduits. When a circuit board is disconnected out of the plugged connection to the motherboard, a fluid conduit positioned proximate thereto is disconnected out of the plugged connection with the fluid manifold. Circuitry having circuit elements mounted upon the circuit boards can be reconfigured into different circuit configurations by connecting additional circuit boards in the plugged connection, or removing circuit boards out of the plugged connection, with the motherboard. A fluid conduit positioned proximate to a circuit board to be moveable together with the circuit board is plugged into the plugged connection with the fluid manifold together with connection of the circuit board into the plugged connection with the computer motherboard. And the fluid conduit is disconnected out of the plugged connection with the fluid manifold together with disconnection of the circuit board out of the plugged connection with the computer motherboard.

In accordance with the present invention, therefore, an assembly, and associated method, for dissipating thermal energy contained in a circuit element of an electrical circuit which is releasably connectable with a substrate to form an electrical connection with the substrate when connected therewith is disclosed. A plate member has a face surface positioned proximate to the circuit element to be movable therewith. A fluid conduit is formed to extend through the plate member and defines an inflow end at a first-end portion thereof and an outflow end at a second-end portion thereof. A fluid manifold is positioned along the substrate and includes an inflow portion and an outflow portion. A coupler couples the inflow end of the fluid conduit with the inflow portion of the manifold and the outflow end of the fluid conduit with the outflow portion of the manifold when the electrical circuit forms the electrical connection with the substrate. A fluid supply supplies fluid to the inflow portion of the manifold and, in turn, to the fluid conduit to circulate therethrough in a heat-exchange relationship with the circuit element when the coupler couples the inflow and outflow ends of the fluid conduit with the inflow and outflow portions, respectively, of the fluid manifold.

A more complete appreciation of the present invention and its scope can be obtained from the accompanying drawings which are briefly summarized below, the following detailed description of presently preferred embodiments of the present invention, and the appended claims.

BRIEF DESCRIPTION OF THE DRAWINGS

FIG. 1 is a perspective view of the assembly of a preferred embodiment of the present invention, here illustrating four separate plate members connected to a single manifold to receive a coolant fluid therefrom;

FIG. 2 is a perspective view of a single plate member and portions of coupling elements which together form portions of the assembly of a preferred embodiment of the present invention;

FIG. 3 is a sectional view taken along lines 3—3 of FIG. 2;

FIG. 4 is a perspective view of a manifold and portions of coupling elements which together form portions of the assembly of a preferred embodiment of the present invention;

FIG. 5 is a longitudinal sectional view of a single coupler, the portions of which are shown in the perspective views of FIGS. 1 and 4;

FIG. 6 is a partial perspective, partial functional block diagram of the assembly of a further preferred embodiment of the present invention; and FIG. 7 is a logical flow diagram listing the method steps of the method of a preferred embodiment of the present invention.

DESCRIPTION OF THE PREFERRED EMBODIMENTS

Turning first to the perspective view of FIG. 1, an assembly, referred to generally by reference numeral 20, is shown. Assembly 20 forms a heat exchanger system which provides a coolant fluid, such as hydrofluorocarbon 134B, in an heat exchange relationship with circuit elements of electrical circuitry disposed upon an electrical circuit board. Thermal energy generated during operation of the circuitry is transferred to the coolant fluid.

Coolant fluid is provided to an inflow portion of fluid manifold 26. The inflow portion of fluid manifold 26 comprises a series of pipe members 32 which are coupled to receive the coolant fluid supplied to the inflow portion of manifold 26 at elbow section 36 of the manifold.

Pipe members 32 are supported upon support tray 40 which extend along the lengths of pipe members 32. Various of the pipe members 32 of the inflow portion of fluid manifold 26 further include elbow sections 44 at the end portions thereof.

Self-closing valve members, hidden from view in the figure, are supported at elbow sections 44 of the pipe members 32. The valve members supported at elbow sections 44 form portions of coupling elements which couple the inflow portion of fluid manifold 26 to fluid conduits 48 formed to extend through plate members 52. Assembly 20 shown in FIG. 1 includes four elbow sections 44 permitting coupling of four fluid conduits 48 extending through four plate members 52.

Fluid conduits 48 define inflow ends 56 at first ends thereof. Self-closing valve members, also hidden from view in the figure, are supported at inflow ends of 56 of the fluid conduits 48. The self-closing valve members supported at the inflow ends 56 of fluid conduits 48 matingly engage with the self-closing valve members supported at elbow sections 44 of the inflow portion of fluid manifold 26 to form coupling elements which couple the inflow ends 56 of the fluid conduits 48 with the inflow portion of manifold 26. The mated engagements between the valve members are formed of plugged connections between valve members which pluggingly engage with one another. When the pairs of valve members are in the plugged connections with one another, the valve members open to form fluid paths between the inflow portion of manifold 26 and the fluid conduits 48.

Fluid manifold 26 further comprises an outflow portion comprised of a series of pipe members 60 which, similar to pipe members 32 of the inflow portion of manifold 26, are also supported upon support tray 40. Pipe members 60 of the outflow portion of fluid manifold 26 include elbow sections 64 at end portions of the pipe members 60.

Self-closing valve members, hidden from view in the figure, are supported at elbow sections 64 of the pipe members 60. The valve members supported at elbow sections 64 form portions of coupling elements which couple the outflow portion of the fluid manifold 26 to the fluid conduits 48 formed to extend through plate members 52.

Fluid conduits 48 also define outflow ends 68 at second ends thereof. Self-closing valve members, also hidden from view in the figure, are supported at outflow ends 68 of the fluid conduits 48. The self-closing valve members supported at the outflow ends 68 of fluid conduits 48 matingly engage with the self-closing valve members supported at elbow sections 64 of the outflow portion of fluid manifold 26 to form coupling elements which couple the outflow ends 68 of the fluid conduits 48 with the outflow portion of fluid manifold 26.

The mated engagements between the valve members are formed of plugged connections between valve members which pluggingly engage with one another. When the pairs of valve members are in the plugged connections with one another, the valve members open to form fluid paths between the outflow portion of manifold 26 and the fluid conduits 48.

When the valve members supported at elbow sections 44 and 64 and at inflow and outflow ends 56 and 68 of fluid conduits 48 engage with one another to couple the fluid conduits 48 to manifold 26, fluid paths are formed between the inflow and outflow portions of fluid manifold 26 by way of the fluid conduits 48. Coolant fluid applied to the inflow portion of fluid manifold 26 at elbow section 36 circulates through the pipe members 32, fluid conduits 48, pipe members 60, and exit the outflow portion of manifold 26 at elbow section 72 of the outflow portion.

Assembly 20 further comprises fluid receptacle 76 having heat exchanger 84 and fluid compressor 80 as portions thereof. Fluid compressor 80 and heat exchanger 84 are operative to compress the coolant fluid applied thereto and to transfer the heat of the coolant fluid, respectively, according to conventional techniques. Fluid receptacle 76 is coupled to elbow section 36 at exit port 86 of receptacle 76 by way of inflow channel 88. Fluid receptacle 76 is also coupled to elbow section 72 at entry port 90 of the fluid receptacle 76 by way of outflow channel 92.

Assembly 20 thereby forms a closed-loop fluid path when any of the fluid conduits 48 which extend through plate members 52 are coupled to fluid manifold 26. Coolant fluid supplied to the inflow portion of fluid manifold 26 by fluid receptacle 76 circulates through the fluid conduits 48 coupled to manifold 26; once the coolant fluid has circulated through the fluid conduits 48, the coolant fluid exits the outflow portion of fluid manifold 26 to be received by fluid receptacle 76.

The plate members 52 through which the fluid conduits 48 extend are positioned such that face surfaces of the plate members 52 are proximate to circuit boards 94 to which circuit elements, here hard disks 98, are mounted. Each of the plate members 52 are sandwiched between a circuit board 94 and a hard disk 98. The plate members are each positioned proximate to circuit elements mountable to circuit boards 94 such that thermal energy generated during operation of electrical circuit elements disposed upon the circuit boards 94 and thermal energy generated during operation of hard disks 98 is transferred to the coolant fluid circulating through the fluid conduits extending through plate members 52 positioned proximate to the circuit boards 94.

Because the fluid conduits 48 are connectable to fluid manifold 26 by way of coupling elements which couple the fluid conduits 48 to the fluid manifolds 26 by plugged connections, the fluid conduits 48 are conveniently connectable to fluid manifold 26 merely by making the plugged connection with the fluid manifold 26. When coolant fluid need not be circulated proximate to a circuit board 94, a fluid conduit 48 extending through a plate member 52 may be disconnected from the fluid manifold 26 simply by removing the fluid conduit out of the plugged connection with the fluid manifold 26. And, because any one, or various ones, of the plate members 52 having fluid conduits 48 formed to extend therethrough may be connected or disconnected from fluid manifold 26 without affecting the connections between fluid manifold 26 and any of the other fluid conduits 48 formed to extend through others of the plate members, fluid conduits 48 contained in any of the plate members 52 may be connected in the plugged connection, or removed out of the plugged connection, with fluid manifold 26 without affecting the flow of coolant fluid through others of the fluid conduits 48. The fluid conduit 48 of each plate member 52 may be pre-charged with the coolant fluid to facilitate "plug and play" field replacement of the circuit board 94, plate member 52 and hard disk 98 through the use of the self-closing valve members at inflow end 56 and outflow end 68 of fluid conduit 48 as will be more fully described hereinafter.

Turning next to the perspective view of FIG. 2, a single plate member 52 is shown. Serpentine-shaped fluid conduit 48 is formed to extend through the plate member 52. Plate member 52 is rectangular in configuration and includes top face surface 154, bottom face surface 158, and four edge surfaces, including edge surface 162.

In the preferred embodiment illustrated in the figure, fluid conduit 48 is formed to extend above the generally planar portion of top face surface 154 of plate member 52. Inflow and outflow ends 56 and 68 of fluid conduit 48 formed at first and second end portions of the fluid conduit 48 are both formed at edge surface 162 of plate member 52. Valve members 172 and 176 are affixed to inflow and outflow ends 56 and 68, respectively, of fluid conduit 48 by insertion of portions of the valve members 172 and 176 into the inflow and outflow ends 56 and 68. Valve members 172 and 176 are self-closing to be normally in the closed position to block passage to the inflow and outflow ends 56 and 68 of fluid conduit 48. Upon application of actuation forces in the direction indicated by arrow 180 in the figure, valve members 172 and 176 open, thereby to form fluid paths through the respective valve members 172 and 176 to fluid conduit 48.

Upon termination of application of the actuation forces in the directions indicated by arrow 180, valve members 172 and 176 return to closed positions, again to block passage through the inflow and outflow ends 56 and 68 of fluid conduit 48. Because valve members 172 and 176 are self-closing, upon termination of the actuation forces thereto, any fluid contained in fluid conduit 48 remains therein, and does not exit either the inflow or outflow end 56 or 68 of the fluid conduit.

FIG. 3 is a sectional view of plate member 52, taken along lines 3—3 of FIG. 2. In the preferred embodiment, and as illustrated, plate member 52 is comprised of a metal-clad material formed of first metallic sheet 264 and second metallic sheet 268. Top-face surface 154 of plate member 52 is defined by a top face surface of first metallic sheet 264, and bottom-face surface 158 of plate member 52 is defined by a bottom-face surface of second metallic sheet 268.

A cladding process is utilized to form a single plate 52 of the two sheets 264 and 268. And, to form fluid conduit 48 to extend through plate member 52, a disbond material is positioned upon selected locations of at least one of the face surfaces of first and second metallic sheets 264 and 268 which face one another. A disbond cladding process similar to the process utilized in the preferred embodiment to form plate member 52 is more fully described in an article entitled "Controlled-Disbond Cladding Adds New Dimension to Metalworking", by Daniel V. Edson in the Jun. 16, 1986 edition of Design News.

Portions of the face surfaces of the at least one of the first and second metallic sheets 264 and 268 upon which the disbond material is coated corresponds to the configuration of fluid conduit 48. Once the disbond material has been applied to the desired locations of the at least one abutting face surface of the first and second metallic sheets 264 and 268, the metallic sheets 264 and 268 are compressed theretogether in a rolling process, and the sheets 264 and 268 are heat-treated, thereby to form a metallurgical bond between the two metallic sheets 264 and 268 at locations other than the locations at which the disbond material is applied.

During heat-treating of the metallic sheets 264 and 268, the disbond material decomposes and forms a gaseous material which causes expansion of the first and second metallic sheets 264 and 268 located proximate thereto, thereby to form a channel which here comprises fluid conduct 48. In a preferred embodiment of the present invention, during heat-treating of the first and second metallic sheets 264 and 268, the metallic sheets are positioned between two dies or a die and a platen to control (i.e., limit) expansion of the disbonded sections of the two metallic sheets 264 and 268. Upon completion of the heat-treating of the metallic sheets 264 and 268, a single plate comprising plate member 52 having fluid conduit 48 extending therethrough is created.

FIG. 4 is a perspective view of manifold 26 previously shown in FIG. 1. Manifold 26 is comprised of an inflow portion and an outflow portion. For purposes of illustration, fluid manifold 26 is divided into four sections, here sections 278, 282, 286 and 290, represented in the figure by blocks shown in dash. Each section 278–290 of fluid manifold 26 encompass parts of the inflow and outflow portions of the manifold 26. The inflow portions encompassed by each of the sections 278-290 each include an upstanding elbow section 44, previously shown in FIG. 1. Similarly, the outflow portions encompassed by each of the sections 278-290 also each include an elbow section 64, also previously shown in FIG. 1. Valve members 232 are affixed to, and supported to extend from, each of the elbow sections 44. Similarly, valve members 236 are affixed to, and are supported to extend from, each of the elbow sections 64 of the outflow portion 212 of fluid manifold 26.

Valve members 232 and 236 are of constructions permitting mated engagement with valve members 172 and 176 (shown in FIG. 2), respectively, affixed to plate member 52. Valve members 232 and 236, also analogous to valve members 172 and 176, are self-closing valves and are normally in the closed position. Valve members 232 and 236 open only upon application of actuation forces in directions indicated by arrow 242. Again similar to valves 172 and 176 illustrated in FIG. 2, upon termination of application of the actuation forces to the valve members 232 and 236, the valve members return to closed positions.

Elbow sections 36 of the inflow portion and elbow sections 72 of the outflow portion permit connection of the inflow and outflow portions of the manifold to a fluid supply receptacle, such as fluid receptacle 76 of FIG. 1.

A plate member, such as plate member 52, having valve members 172 and 176 affixed thereto, is connectable to any of the sections 278-290 of fluid manifold 26 by aligning valve members 172 and 232 and valve members 176 and 236 and thereafter causing mated engagement between the respective pairs of valve members. The pairs of valve members 172–232 and 176-236 are thereby operative to couple the fluid conduit 48 formed to extend through plate member 52 to the inflow and outflow portions of fluid manifold 26. Because valve members 172, 176, 232, and 236 are all self-closing valves and are operative to open only during times in which actuation forces are applied to the respective valve members, a fluid path between the inflow and outflow portions of fluid manifold 26, by way of fluid conduit 48, is created only during times in which coupling elements formed of the pairs of valve members engage with one another to cause opening of the respective valve members.

Further, because fluid manifold 26 comprises a plurality of sections, here sections 278, 282, 286 and 290, a number of plate members 52 may be connected to fluid manifold 26, and thereafter disconnected therefrom without affecting the connections of other ones of the plate members 52 with fluid manifold 26.

FIG. 5 is a longitudinal, sectional view of a single coupling element, here referred to generally by reference 250, comprised of valve member 172 and valve member 232. (A coupling element 250 comprised of a pair of valve members 176 and 236 may be identically shown.) As mentioned previously, the valve members 172 and 232 (and also valve members 176 and 236) are all self-closing valves. The valve members open only upon application of actuation forces thereto. Valve members 172 and 232 permit a plug-and-socket type of connection (i.e., a plugged connection) therebetween. Valve members similar to valve members 172 and 232 (and also valve members 176 and 236) which together form coupling element 250 are marketed by Colder Products Company of 1001 Westgate Drive, St. Paul, Minn. 55114 as "CPC Couplings". The pair of valve members comprising coupling element 250 are shown in plugged connection with one another. When in the plugged connection, actuation forces are exerted upon both valve members 172 and 232 to position both valve members in the open positions, thereby to form a fluid path therebetween.

Valve member 172 is shown to include spring 256 and plug body 262. Plug body 262 is translatable together with spring 256. When in the unbiased position, spring 256 positions plug body 262 at a right-side portion of the valve chamber extending through valve member 172. When positioned at the right-side portion of the valve chamber, plug body 262 closes valve member 172 by blocking the valve channel of valve member 172. When actuation forces are applied to spring 256 to cause compression thereof, plug body 262 is translated out of the position at the right-side portion of the valve chamber of valve member 172 (and into, e.g., the position illustrated in the Figure), thereby forming a fluid channel through the valve member.

Valve member 232 similarly includes a spring, here spring 264, and a plug body, here plug body 272. Plug body 272 is translatable with spring 264. When spring 264 is in the unbiased position, plug body 272 is positioned at a left-side portion of the valve chamber extending through valve member 232. Upon application of an actuation force, spring 264 is compressed, and plug body 272 is translated out of the position at the left-side portion of the valve chamber of valve member 232 (and into, e.g., the position illustrated in the Figure) thereby to form a fluid path through the valve member.

When the valve members are positioned in the mated engagement with one another, and as illustrated in the figure, engagement of the respective valve members 172 and 232 cause actuation forces to be applied upon springs 256 and 264 by way of plug bodies 262 and 272, respectively, to cause compression of the springs, and thereby to form a fluid path through the valve members 172 and 232. When the valve members 172 and 232 of coupling element 250 are released out of the mated engagement therebetween, actuation forces are not applied to springs 256 and 264, and the valve members 172 and 232 close. Thereby, when the valve members of coupling element 250 are in mated engagement with one another, a fluid path is formed between the respective valve members and, when the valve members are released out of the mated engagement therebetween, the fluid path between the valve members is immediately closed.

FIG. 6 is a partial perspective, partial functional-block diagram of a portion of assembly 20 of FIG. 1 positioned at a computer motherboard 280. Inflow and outflow portions of fluid manifold 26 extend along motherboard 280, and elbow sections 44 and 64 of the respective portions of manifold 26 extend through the motherboard 280 such that valve members 232 and 236 are positioned to receive valve members 172 and 176 affixed to inflow and outflow ends 56 and 68 of fluid conduit 48 extending through plate member 52.

Plate member 52 is positioned proximate to circuit board 94 and to hard disk 98. Circuit board 94 is shown to include edge connectors 286 printed along an edge portion of the circuit board. Circuit board 94 is of dimensions permitting insertion of a portion of the circuit board into slot 292 of motherboard 280. When the portion of circuit board 94 is inserted into slot 292 of motherboard 280, the edge connectors 286 of circuit board connect circuit elements disposed or mounted thereupon to the motherboard 280 in an electrical connection therewith.

When plate member 52 and circuit board 94 are positioned to move in unison, such as when threaded fasteners or the like are utilized to fasten the plate member 52 and circuit board 94 theretogether, and by proper positioning of elbow sections 44 and 64 of manifold 26 relative to motherboard 280, the same motion utilized to connect circuit board 94 with motherboard 280 connects valve member 172 with valve member 232 and valve member 176 with valve member 236. And, even when plate member 52 is not fastened to circuit board 94 to be translatable in unison therewith, plate member 52 is still connectable to manifold 26 by way of a simple plug connection between the pairs of valve members 172–232 and 176–236. Disconnection of plate member 52 and manifold 26 is effectuated in a reverse motion.

Manifold 26, plate member 52, circuit board 94, motherboard 280, and hard disk 98 are positioned within a computer cabinet which is represented by block 296 shown in dash. Elbow sections 36 and 72 of manifold 26 extend beyond the cabinet to be connectable with the entry and exit ports 90 and 86 of fluid receptacle 76. Fluid receptacle 76 is again shown to comprise fluid compressor 80 and heat-exchanger 84.

Flow rate controller 296 is also shown in the Figure and is connected in-line between fluid receptacle 76 and elbow section 36 of manifold 26. Flow rate controller 296 is operative to control the rate of coolant fluid flow through the manifold 26 and fluid conduit 48. By increasing or decreasing the rate of fluid flow, heat exchange between an electrical circuit formed upon circuit board 94 (of which hard disk 98 forms a portion) and the coolant fluid flowing through fluid conduit 48 may be altered.

Temperature sensor 300 is further shown connected to flow rate controller 296. In one preferred embodiment of the present invention, temperature sensor 300 is positioned to measure temperature levels about the circuitry that assembly 20 is positioned to cool. When the temperature sensor 300 senses an increased temperature level, flow rate controller 296 is operative to cause an increase in the fluid flow rate responsive to the sensing of the increased temperature levels. Temperature sensor 300 may further be utilized to generate a signal which causes ambient temperature controller 312 to modify temperature levels of the environment in which assembly 20 is located.

Humidity sensor 318 is additionally coupled to flow rate controller 296 in the preferred embodiment of FIG. 6. Humidity sensor 318 is operative to sense moisture levels and calculate relative humidity levels. When humidity sensor 318 generates signals indicative that relative humidity levels are increasing beyond a specified level, flow rate controller 296 is operative to reduce the flow rate of coolant fluid, thereby to minimize the possibility of condensation forming upon plate member 52. Additional manners of controlling the rate of flow of coolant fluid are, of course, also possible.

Turning finally now to FIG. 7, the method steps of a method, referred to generally by reference 900, are listed. Method 900 is a method for dissipating thermal energy contained in a circuit element of an electrical circuit which is releasably connectable with a substrate for forming an electrical connection with the substrate when connected therewith.

First, and as indicated by block 906, a plate member having a fluid conduit formed to extend therethrough, is positioned proximate to the circuit element to be moveable therewith.

Next, and as indicated by block 912, a fluid manifold is positioned to extend along the substrate.

Then, and as indicated by block 918, the fluid conduit is coupled to the manifold.

Finally, and as indicated by block 924, fluid is supplied to the manifold and, in turn, to the fluid conduit to circulate therethrough in a heat-exchange relationship with the circuit element.

Numerous advantages accrue as a result of using assembly 20 which includes fluid conduit 48 extending through plate member 52 and which is pluggable into fluid manifold 26 to form the plugged connection therewith. Thermal energy generated during operation of circuitry positioned proximate to the fluid conduit is transferred to coolant fluid flowing through the conduit. The fluid conduit 48 is repositionable merely by unplugging the fluid conduit out of the plugged connection with manifold 26 and thereafter forming a new plugged connection at a different location of fluid manifold 26. Accordingly, when circuitry, proximate to which fluid conduits 48 of assembly 22 are positioned, is reconfigured (such as by adding circuit boards or repositioning circuit boards), fluid conduits 48 of assembly 20 are similarly repositionable. And, because valve members 172, 176, 232, and 236 which couple the fluid conduits 48 with manifold 26 are self-closing, any of the fluid conduits extending through any of the plate members 52 may be removed out of, or placed into, plugged connections with manifold 26 without affecting the flow of coolant fluid through any of the other fluid manifolds 48.

While the present invention has been described in connection with the preferred embodiments of the various figures, it is to be understood that other similar embodiments may be used and modifications and additions may be made to the described embodiments for performing the same functions of the present invention without deviating therefrom. Therefore, the present invention should not be limited to any single embodiment, but rather construed in breadth and scope in accordance with the recitation of the appended claims.

We claim:

1. An assembly for dissipating thermal energy within an electrical circuit element that includes a first electrical connector, said circuit element being physically mounted on a substrate to electrically cooperate therewith by operation of a second electrical connector that is carried by said substrate and is mateable with said first electrical connector, said assembly comprising:

a cooling plate member positioned proximate to said circuit element and physically moveable as a unit with said circuit element;

a fluid conduit formed to extend through said plate member, said fluid conduit having a fluid inflow end and a fluid outflow end;

a fluid manifold positioned on said substrate, said fluid manifold having a fluid inflow portion and a fluid outflow portion;

first normally closed and manually openable fluid flow coupler means for coupling said inflow end of said fluid conduit to said inflow portion of said manifold, said first coupler means having a first member physically associated with said first electrical connector element and having a second member physically associated with said second electrical connector;

second normally closed and manually openable fluid flow coupler means for coupling said outflow end of said fluid conduit to said outflow portion of said manifold, said second first coupler means having a first member physically associated with said first electrical connector and having a second member physically associated with said second electrical connector;

said first and second coupler means operating such that when said circuit element is mounted on said substrate said first and second members of said first and second coupler means are concomitantly coupled and said first and second coupler means are concomitantly opened to facilitate fluid flow therethrough; and a supply of cooling fluid connected to said manifold, said supply of cooling fluid operating to supply cooling fluid to said inflow portion of said manifold when said circuit element is mounted on said substrate.

2. The assembly of claim 1 wherein said plate member is comprised of a metal-clad material formed of at least a first metallic sheet and a second metallic sheet positioned in face-to-face engagement with one another and bonded theretogether at selected locations therebetween.

3. The assembly of claim 2 wherein the fluid conduit is formed of the first metallic sheet and the second metallic sheet of the metal-clad material comprising the plate member.

4. The assembly of claim 3 wherein the fluid conduit is of a configuration defined by unbonded locations between the first metallic sheet and the second metallic sheet of the metal-clad material comprising the plate member.

5. The assembly of claim 1 wherein said inflow end and said outflow end of said fluid end said fluid conduit are formed at a single side of said plate member.

6. The assembly of claim 1 wherein the fluid conduit is configured in a serpentine-like configuration.

7. The assembly of claim 1 wherein said fluid manifold is positioned beneath a top surface of substrate and wherein said inflow portion and said outflow portion each include an upwardly-extending elbow section extending through said substrate.

8. The assembly of claim 7 wherein said first coupler means comprises a first pair of mating and self-closing coupling elements for coupling said inflow end of said fluid conduit with an elbow section of said inflow portion of said manifold and wherein said second coupler means comprises a second pair of mating and self-closing coupling elements for coupling said outflow end of said fluid conduit with an elbow section of said outflow portion of said manifold.

9. The assembly of claim 8, wherein said first and second pairs of mating and self-closing valves are positioned out of mated engagement and are each closed, thereby to prevent fluid flow therethrough when said circuit element is positioned out of the electrical connection with said substrate.

10. The assembly of claim 1 wherein said fluid supply which supplies the fluid to the inflow portion of the manifold comprises a fluid receptacle having an entry port coupled to the outflow portion of the manifold and an exit port coupled to the inflow portion of the manifold to form thereby a closed-loop fluid path for circulation of the fluid to the fluid conduit.

11. The assembly of claim 10 wherein the fluid supplied to the inflow portion of the manifold by the fluid receptacle comprises a gaseous fluid and wherein the fluid receptacle comprises a fluid compressor as a portion thereof, said fluid compressor for compressing the gaseous fluid supplied thereto through the entry port of the fluid receptacle.

12. The assembly of claim 11 wherein the fluid receptacle further comprises a heat exchanger coupled to the fluid compressor to receive fluids compressed thereat, said heat exchanger for transferring heat energy contained in the fluids supplied thereto by the fluid compressor thereaway.

13. The assembly of claim 1, further comprising a fluid flow rate controller responsive at least in part to ambient temperature levels proximate to the electrical circuit and the circuit element thereof, said fluid flow rate controller for controlling flow rates of the fluid supplied to the fluid manifold and, in turn, to the fluid conduit.

14. An assembly for cooling an electrical circuit element that is mounted on an electrical circuit board, said circuit board being physically mountable on and electrically connected to a computer motherboard by operation of a pluggable electrical connector having a first connector portion associated with said circuit board and having a second connector portion associated with said substrate, to thereby mount said circuit element on said motherboard and electrically connect said circuit element to said motherboard by operation of said electrical connector, said assembly comprising:

a cooling plate member positioned to abut said circuit board, said plate member being moveable with said circuit board;

a fluid conduit formed to extend through said plate member, said fluid conduit having an inflow end and an outflow end;

a fluid manifold positioned on said substrate, said fluid manifold having an inflow portion and an outflow portion;

normally closed fluid-flow plug coupler means having first portions affixed to said plate member and having second mating portions affixed to said fluid manifold;

said plug coupler means being opened to fluid flow, and operating to couple said inflow end of said fluid conduit to said inflow portion of said manifold, and operating to couple said outflow end of said fluid conduit to said outflow portion of said manifold, when said electrical circuit board is physically mounted on and electrically connected to said motherboard by operation of said electrical connector; and a cooling fluid supply comprised of a fluid receptacle having an entry port coupled to said outflow portion of said manifold and having an exit port coupled to said inflow portion of said manifold, to thereby form a closed-loop fluid path for circulation of cooling fluid when said plug coupler means operates to couple said inflow and outflow ends of said fluid conduit to said inflow and outflow portions, respectively, of said fluid manifold.

15. A method for dissipating thermal energy that is contained in a circuit element of an electrical circuit, said electrical circuit being physically mountable on a substrate in a manually releasable manner, to thereby form an electrical connection between said substrate and said electrical circuit when said electrical circuit is manually mounted on said substrate, said method comprising the steps of:

providing a cooling plate proximate to said circuit element so as to be movable therewith;

providing a fluid-flow conduit extending through said plate, said conduit having a normally closed inflow end and a normally closed outflow end;

providing a fluid-flow manifold on said substrate, said manifold having a normally closed inflow portion and a normally closed outflow portion;

supplying cooling fluid to said manifold for flow through said outflow portion when said outflow portion is open;

manually mounting said electrical circuit on said substrate in a releasable manner, to thereby form an electrical connection between said substrate and said electrical circuit;

concomitant with said mounting step, coupling said inflow end of said conduit with said inflow portion of said manifold and opening said inflow end and said inflow portion to fluid flow; and concomitant with said mounting step, coupling said outflow end of said conduit with said outflow portion of said manifold and opening said outflow end and said outflow portion to fluid flow.

* * * * *